(12) United States Patent
Patil et al.

(10) Patent No.: US 9,287,868 B1
(45) Date of Patent: Mar. 15, 2016

(54) LOGIC CELL FOR PROGRAMMABLE LOGIC DEVICE

(71) Applicant: QuickLogic Corporation, Sunnyvale, CA (US)

(72) Inventors: Vishnu A. Patil, Bangalore (IN); Wilma W. Shiao, San Jose, CA (US); Tarachand Pagarani, Bangalore (IN); Pinaki Chakrabarti, Bangalore (IN)

(73) Assignee: QuickLogic Corporation, Sunnyvale, CA (US)

( * ) Notice: Subject to any disclaimer, the term of this patent is extended or adjusted under 35 U.S.C. 154(b) by 0 days.

(21) Appl. No.: 14/476,515

(22) Filed: Sep. 3, 2014

Related U.S. Application Data

(60) Provisional application No. 62/042,720, filed on Aug. 27, 2014.

(51) Int. Cl.
  *H03K 19/173* (2006.01)
  *H03K 19/177* (2006.01)
  *H03K 19/00* (2006.01)

(52) U.S. Cl.
  CPC ........ *H03K 19/0008* (2013.01); *H03K 19/1774* (2013.01); *H03K 19/17728* (2013.01)

(58) Field of Classification Search
  CPC ............ H03K 19/17728; H03K 19/1737
  USPC ................................. 326/38, 40, 41, 46, 47
  See application file for complete search history.

(56) References Cited

U.S. PATENT DOCUMENTS

| | | | |
|---|---|---|---|
| 5,923,195 A | 7/1999 | Graf, III | |
| 6,078,191 A | 6/2000 | Chan et al. | |
| 6,107,822 A * | 8/2000 | Mendel et al. | 326/39 |
| 6,118,300 A | 9/2000 | Wittig et al. | |
| 6,426,649 B1 | 7/2002 | Fu et al. | |
| 6,611,153 B1 | 8/2003 | Lien et al. | |
| 6,636,070 B1 | 10/2003 | Altaf | |
| 7,009,421 B2 | 3/2006 | Pugh et al. | |
| 7,573,291 B1 | 8/2009 | Agrawal et al. | |
| 7,592,834 B1 | 9/2009 | Agrawal et al. | |
| 7,696,784 B1 | 4/2010 | Agrawal et al. | |

* cited by examiner

*Primary Examiner* — Daniel D Chang
(74) *Attorney, Agent, or Firm* — Silicon Valley Patent Group LLP

(57) ABSTRACT

A logic cell in a programmable logic device receives an external signal from a routing network that serves as a select signal that selects a combinatorial logic signal via a first multiplexor as well as a data input to a second multiplexor. The second multiplexor selects between the combinatorial logic signal and the external signal and provides an output signal to a register. Accordingly, the logic cell has the flexibility to support a combinatorial and/or sequential function using minimal routing resources. A third multiplexor may select the output from the register or another signal as the output signal from the logic cell. A clock signal to the register may be gated off when the register output is not selected as the output signal, thereby reducing dynamic power consumption. The programmable logic device may include a number of super logic cells, each of which includes a plurality of logic cells.

39 Claims, 6 Drawing Sheets

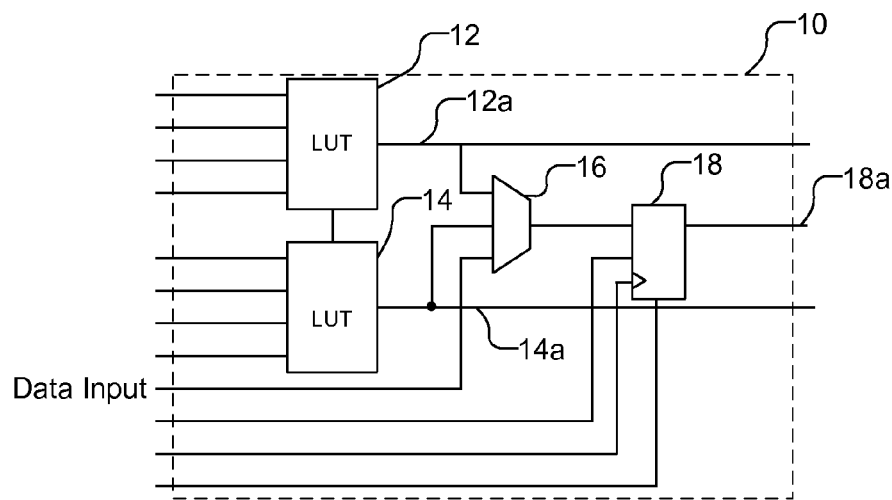
Fig. 1
(Conventional)

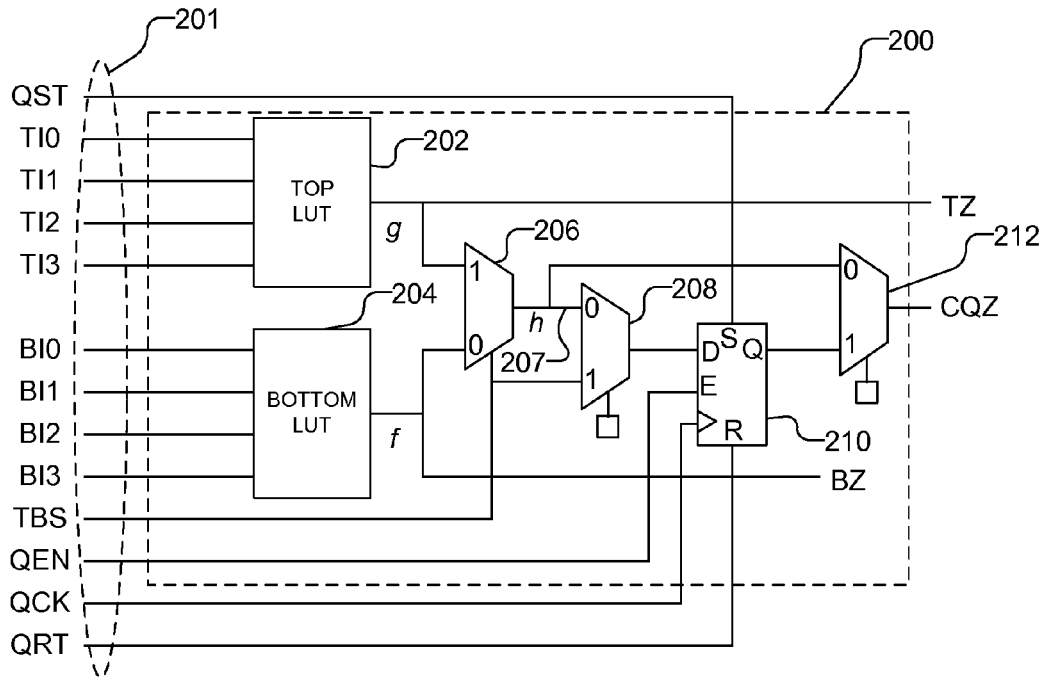

Fig. 3

Selecting between a first output signal from a first logic element and a second output signal from a second logic element based on a select signal from a routing network to produce a combinatorial logic signal —252

Selecting between the combinatorial logic signal and the select signal from the routing network to produce a register data input signal —254

Receiving the register data input signal with a register —256

Fig. 4

LOGIC CELL FOR PROGRAMMABLE LOGIC DEVICE

CROSS REFERENCE TO RELATED APPLICATIONS

This application claims priority under 35 USC 119 to U.S. Provisional Application No. 62/042,720, filed Aug. 27, 2014, which is incorporated by reference herein in its entirety.

TECHNICAL FIELD

The present invention relates to programmable logic devices, and more specifically to logic cells used in programmable logic devices.

BACKGROUND

A programmable logic device, sometimes referred to as programmable application specific integrated circuit (PASIC), field programmable gate array, or complex programmable logic device (CPLD), is a versatile integrated circuit chip, the internal circuitry of which may be configured by an individual user to realize a user-specific circuit. To configure a programmable logic device, the user configures an on-chip interconnect structure of the programmable logic device so that selected input terminals and selected output terminals of selected on-chip circuit components are electrically connected together in such a way that the resulting circuit is the specific circuit desired by the user.

Programmable logic devices include a number of programmable logic blocks that are interconnected by a programmable routing network, sometimes referred to as a programmable interconnect. A logic block may be comprised of one or more logic cells, wherein a logic cell, in general, is made up of one or more logic elements with a defined number of inputs and outputs coupled to the routing network. For example, a logic cell, the core unit of a logic block, may include a combination of lookup tables (LUTs) and registers, that receives input signals from the routing network, as well as produce output signals to the routing network. During configuration of the programmable logic device, the truth table for each lookup table is programmed to implement a desired logical function.

FIG. 1, by way of example, illustrates a conventional logic cell 10, which includes two LUTs 12, 14, a multiplexor 16 and a register 18. Each LUT 12, 14 receives four inputs from a routing network (not shown). The combinatorial outputs 12a, 14a of each LUT 12, 14 may be provided as a direct output of the logic cell 10, and are also received by multiplexor 16. The multiplexor 16 further receives a third input Data Input from the routing network. The multiplexor 16 selects from the combinatorial outputs 12a, 14a, and Data Input to provide an output signal that is received by register 18. The selection by multiplexor 16 may be fixed, e.g., based on the initial programming of the programmable logic device to a tie high (VDD) signal or a tie low (GND) signal, or may be dynamic, which requires two additional resources from the routing network. The register 18 receives a clock signal from the routing network, as well as other control signals (e.g., SET, RESET) and produces an output signal 18a, which may be provided as an output of the logic cell 10.

There is a desire in the art for improved programmable logic block architectures that provide a more efficient use of routing resources and power.

SUMMARY

A logic cell in a programmable logic device receives an external signal from a routing network that serves as an external select input signal to a first multiplexor to select between output signals from logic elements, e.g., Look Up Tables, as well as a data input to a second multiplexor. The second multiplexor selects between the combinatorial logic signal from the first multiplexor and the external signal that serves as the data input and provides an output signal to a register. Accordingly, the logic cell has the flexibility to support either a combinatorial or sequential function, or both, using minimal routing resources. Additionally, a third multiplexor may select the output from the register or another signal as the output signal from the logic cell. A clock signal to the register may be gated off when the register output is not selected as the output signal, thereby reducing dynamic power consumption. The programmable logic device may include a number of super logic cells, each of which includes a plurality of logic cells.

In one implementation, a programmable logic device includes a routing network; a plurality of logic cells, each logic cell in the plurality of logic cell comprises a plurality of input terminals coupled to the routing network and at least one output terminal, the logic cell comprising: a first logic element having a first plurality of input terminals coupled to the routing network and a first output terminal; a second logic element having a second plurality of input terminals coupled to the routing network and a second output terminal; a first multiplexor having a first mux input terminal coupled to the first output terminal and a second mux input terminal coupled to the second output terminal and a first multiplexor select terminal coupled to receive a dynamic select signal from the routing network, the first multiplexor having a third output terminal; a second multiplexor having a third mux input terminal coupled to the third output terminal and a fourth mux input terminal coupled to the first multiplexor select terminal coupled to receive the dynamic select signal from the routing network, the second multiplexor having a fourth output terminal; and a register having a register data terminal coupled to the fourth output terminal and a fifth output terminal coupled to an output terminal of the logic cell.

In one implementation, a method performed by a logic cell within a programmable logic device includes selecting between a first output signal from a first logic element and a second output signal from a second logic element based on a select signal from a routing network to produce a combinatorial logic signal; selecting between the combinatorial logic signal and the select signal from the routing network to produce a register data input signal; and receiving the register data input signal with a register.

In one implementation, a programmable logic device includes a routing network; a plurality of super logic cells coupled to the routing network, each of the plurality of super logic cells comprises a plurality of logic cells, wherein each logic cell in the plurality of logic cells receives at least one common signal from the routing network and wherein each logic cell comprises a plurality of input terminals coupled to receive different signals from the routing network and at least one output terminal and comprises: a first logic element having a first plurality of input terminals coupled to the routing network and a first output terminal; a second logic element having a second plurality of input terminals coupled to the routing network and a second output terminal; a first multiplexor having a first mux input terminal coupled to the first output terminal and a second mux input terminal coupled to the second output terminal and a first multiplexor select terminal coupled to receive a dynamic select signal from the routing network, the first multiplexor having a third output terminal; a second multiplexor having a third mux input terminal coupled to the third output terminal and a fourth mux input terminal coupled to the first multiplexor select terminal coupled to receive the dynamic select signal from the routing network, the second multiplexor having a fourth output terminal; and a register having a register data terminal coupled to the fourth output terminal and a fifth output terminal coupled to an output terminal of the logic cell.

In one implementation, a programmable logic device comprising a logic cell includes a register having a register data terminal, a clock terminal, and a first output terminal; a first multiplexor comprising a first input terminal, a second input terminal coupled to the first output terminal of the register, a select terminal, and a second output terminal coupled to an output terminal of the logic cell; and a logic gate having a third input terminal coupled to the select terminal of the first multiplexor, a fourth input terminal coupled to receive a clock signal, and a third output terminal, wherein the third output terminal of the logic gate is coupled to the clock terminal of the register.

In one implementation, a method performed by a logic cell in a programmable logic device includes receiving a signal with a register; selecting an output signal to be produced by the logic cell from one of an output signal from the register or a second signal from within the logic cell; and gating a clock signal to the register, wherein the clock signal is provided to the register when the output signal from the register is selected as the output signal and the clock signal is gated off when the second signal from within the logic cell is selected as the output signal.

BRIEF DESCRIPTION OF THE DRAWINGS

FIG. 1 illustrates a conventional logic cell.

FIG. 3 illustrates a logic cell select between a combinatorial logic signal and a data signal from the routing network using minimal routing resources.

FIG. 4 is a flow chart illustrating a method performed by a logic cell for selection between a combinatorial logic signal and a data signal.

DETAILED DESCRIPTION

Figure 2:
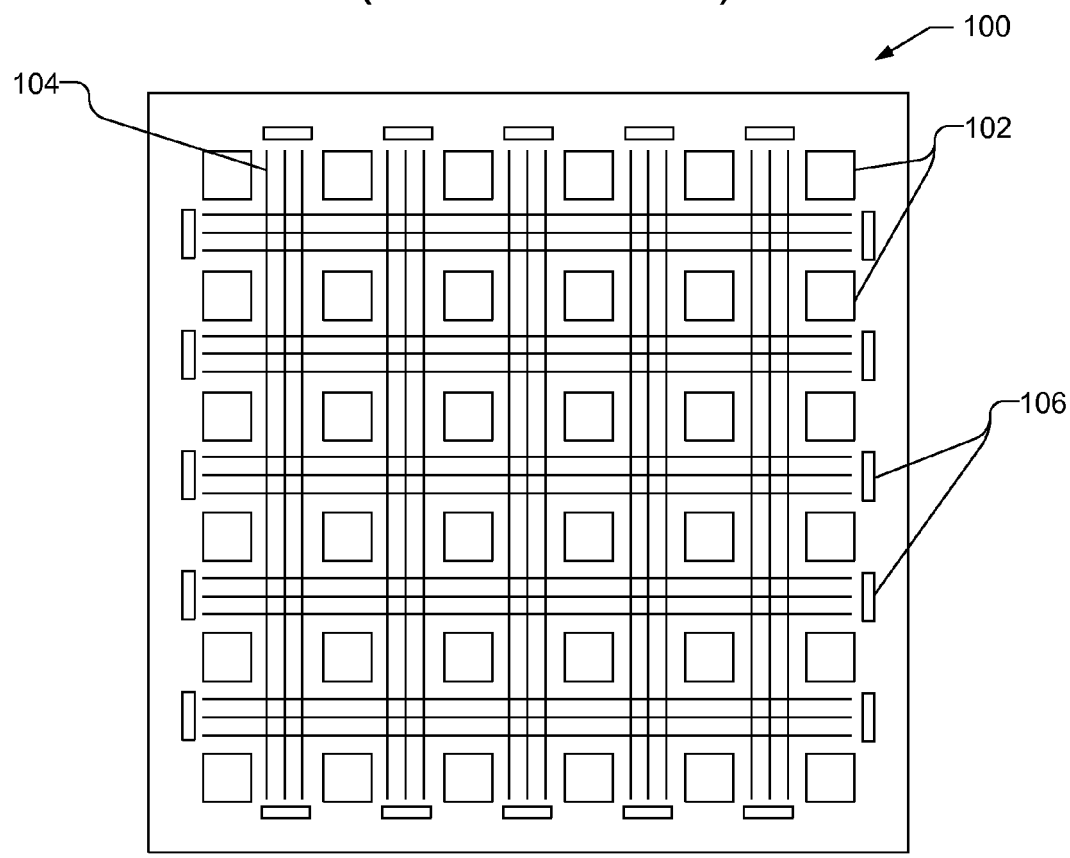
FIG. 2 illustrates a schematic view of an islanded programmable logic device that includes a number of logic blocks.

FIG. 2 shows a schematic view of an islanded programmable logic device 100, such as a programmable application specific integrated circuit (PASIC), field programmable gate array (FPGA) or complex programmable logic device (CPLD) or similar devices. Programmable device 100 is illustrated with a number of rows and columns of logic blocks 102 with an interconnecting routing network 104, shown schematically as horizontal and vertical lines. Programmable device 100 may have more or fewer logic blocks 102 than is illustrated in FIG. 2. A number of input/output ("I/O") cells 106 is also shown in FIG. 2 connected to the routing network 104. Routing network 104 is populated with programmable elements, such as SRAM, EPROM, etc. that may be programmed to interconnect desired logic blocks 102 and I/O blocks 106 in various configurations as desired by the user.

FIG. 3 illustrates a logic cell 200 that combines both combinatorial and sequential logic so it can support both combinatorial and sequential functions at the same time. Logic cell 200 may serve as a logic block or as a component of a logic block in a programmable logic device, such as that illustrated in FIG. 2 and is connected to a routing network 201. The routing network may be any desired routing network such as that described in U.S. Ser. No. 14/476,518, entitled "Routing Network for Programmable Logic Device," by Vishnu A. Patil et al., filed concurrently herewith, which is incorporated herein by reference in its entirety. The logic cell 200 is illustrated as including two four-input Look-Up Tables (LUTs) 202 and 204, as well as three two-input multiplexors 206, 208, and 212, and a register 210. The number of LUTs, the number of inputs to the LUTs, as well as the number of inputs to the multiplexors may be altered, if desired. As illustrated, the logic cell 200 includes combinatorial as well as sequential logic implemented within it. As can be seen in FIG. 3, the logic cell 200 receives a TBS input signal from a routing network 201, which can be any type of signal coming to logic cell 200 (e.g., as feedback) or from another logic cell, e.g., as the output of either a combinatorial or sequential function. The TBS input signal may serve as a dynamic selection signal for the multiplexer 206 or may serve as a data input signal to multiplexor 208, which may be provided to register 210. Thus, the TBS input signal may be used as input of either a combinatorial or sequential function of the logic cell 200. The output CQZ of the logic cell 200 may be selected via multiplexor 212 as the combinatorial output from the logic elements (LUTs 202 and 204) via multiplexor 206 or the output of register 210.

The combinatorial logic includes the two LUTs (a top LUT 202 and a bottom LUT 204), a direct input selection 2×1 multiplexor 206 coupled to the register 210 via 2×1 multiplexor 208, and another 2×1 multiplexor 212 that selects between the output of the register 210 and the output of the combinatorial logic provided by LUTs 202, 204 and multiplexor 206. Each LUT 202 and 204 has four input terminals coupled to the routing network 201 at inputs TI0, TI1, TI2, TI3 for top LUT 202 and BI0, BI1, BI2, BI3 for bottom LUT 204. The output terminal of the top LUT 202 may be provided as output TZ of the logic cell 200 and/or may be provided as feedback within the logic cell 200 or a local array of logic cells. The output terminal of the bottom LUT 204 may also be produced as an output BZ of the logic cell 200 and/or may be provided as feedback within the logic cell 200 or a local array of logic cells.

The output terminals of the top LUT 202 and bottom LUT 204 are also coupled as inputs to 2×1 multiplexor 206. A select terminal of the multiplexor 206 is coupled to the TBS input from the routing network 201. As illustrated, the select terminal for the multiplexor 206, and thus, the input TBS is also coupled to an input terminal of the second 2×1 multiplexor 208. The multiplexor 206 produces a combinatorial logic signal on its output terminal 207. Additionally, the output terminal 207 of multiplexor 206 is coupled to the second input of multiplexor 208. The output terminal of the multiplexor 208 is coupled to the data D input of the register 210. The select terminal of the multiplexor 208 may be fixed, e.g., an SRAM-bit programmed at time of initiation of the programmable logic device to a tie high (VDD) signal or a tie low (GND) signal. It can be seen that the single input TBS from the routing network 201 may be used as either a dynamic select signal to produce a combinatorial logic signal at 207 from multiplexor 206 or as data input provided to register 210.

The sequential logic in logic cell 200 is the register 210. In general, sequential logic is a type of logic circuit whose output depends not only on a present value of its input signals but on the past history of its inputs. The register 210, illustrated as a D-type flip-flop, has a data D input terminal coupled to the output terminal of multiplexor 208, as well as a clock terminal driven by input QCK from the routing network 201. The register 210 may further include a flip-flop enable input terminal E driven by input QEN, set signal input terminal driven by QST and reset signal input terminal driven by QRT. The register 210 includes an output terminal Q that is coupled to a first input terminal of the third 2×1 multiplexor 212. As can be seen, the output of first multiplexor 206 may also be coupled to an input terminal of the third multiplexor 212. The select terminal of the multiplexor 212, thus, selects between the output of the register 210 and the output of the combinatorial logic provided by LUTs 202 and 204 and multiplexor 206. The output terminal of multiplexor 212 may be provided as output CQZ of the logic cell 200 and/or may be provided as feedback within the logic cell 200 or a local array of logic cells. The select terminal of the multiplexor 212 may be fixed, e.g., an SRAM-bit programmed at time of initiation of the programmable logic device a tie high (VDD) signal or a tie low (GND) signal.

Thus, the logic cell 200 combines both combinatorial and sequential logic so it can support both combinatorial and sequential functions at the same time using minimal routing resources. For example, Table 1 below illustrates logic functions supported by logic cell 200 as illustrated in FIG. 3, where 1 is tie high (VDD) and 0 is tie low (GND), X indicates a dynamic select signal and Y indicates do not care, i.e., either tie high or tie low.

TABLE 1

| Mux 206 Select (TBS) | Mux 208 Select | Mux 212 Select | Functions | Output |
|---|---|---|---|---|
| X | 1 | 1 | Top LUT combinatorial function | TZ |
|   |   |   | Bottom LUT combinatorial function | BZ |
|   |   |   | TBS Data In sequential function | CQZ |
| X | Y | 0 | Up to a certain set of 9-variable combinatorial function with TBS as one of those variables | CQZ |
| X | 0 | 1 | Up to a certain set of 9-variable sequential function with TBS as one of those variables | CQZ |
| 1 | 0 | 1 | Top LUT sequential function | CQZ |
| 0 | 0 | 1 | Bottom LUT sequential function | CQZ |

With one four input LUT, any of the $2^{2^4}$ number of Boolean functions can be realized. The logic cell 200 may be used to implement up to all 5 inputs and some 6, 7, 8 and 9-input combinatorial or sequential functions. To implement all 5-input functions, the routing network 201 may connect TI0 to BI0; TI1 to BI1, TI2 to BI2 and TI3 to BI3. At the output h at the terminal 207 of the first multiplexor 206, the 5-input combinatorial function may be expressed as follows.

$$h(TBS,TI0,TI1,TI2,TI3)=TBS'\cdot f(TI0,TI1,TI2,TI3)+TBS\cdot g(TI0,TI1,TI2,TI3) \quad \text{Eq. 1}$$

Additionally, it is possible to implement some of the 6-, 7-, 8- and 9-input functions. For example, for implementations of a 7-input function, the routing network 201 may connect, e.g., TI0 to BI0, TI1 to BI1. At the output h at the terminal 207 of the first multiplexor 206, the 7-input combinatorial function may be expressed as follows.

$$h(TBS,TI0,TI1,TI2,TI3,BI2,BI3)=TBS'\cdot f(TI0,TI1,BI2,BI3)+TBS\cdot g(TI0,TI1,TI2,TI3) \quad \text{eq. 2}$$

Implementation of some of the 6-, 8-, and 9-input functions may be similarly formed. It should be noted that only those type of 9-input functions can be implemented that can be decomposed in the following form:

$$h=TBS'\cdot f(BI0,\ldots,BI3)+TBS\cdot g(TI0,\ldots TI3) \quad \text{eq. 3}$$

If the selection for multiplexor 206 were fixed, e.g., a programmed SRAM-bit, the logic cell 200 could only statically select a particular function $f$ or $g$, which is simply a four input function at h. However, because TBS is supplied externally to the logic cell 200, the logic cell 200 has additional flexibility to implement bigger functions (as discussed above) on the fly as and when required. Accordingly, the logic synthesis is more powerful in terms of optimizing the logic with respect to area, path length and timing.

Thus, as can be seen in FIG. 4, a method is performed by a logic cell within a programmable logic device that includes selecting between a first output signal from a first logic element and a second output signal from a second logic element based on a select signal from a routing network to produce a combinatorial logic signal (252). For example, multiplexor 206 selects between the output signals from top LUT 202 and bottom LUT 204 based on the TBS input from the routing network and produces a combinatorial logic signal at terminal 207. One of the combinatorial logic signal and the select signal from the routing network is selected, e.g., by multiplexor 208, to produce a register data input signal (254). The register 210 receives the register data input signal (256). Additionally, an output signal from the logic cell, e.g., CQZ, may be selected from one of an output signal from the register 210 or a signal from within the logic cell. For example, the signal from within the logic cell may be the combinatorial logic signal, e.g., at terminal 207 of the multiplexor 206.

Figure 5:
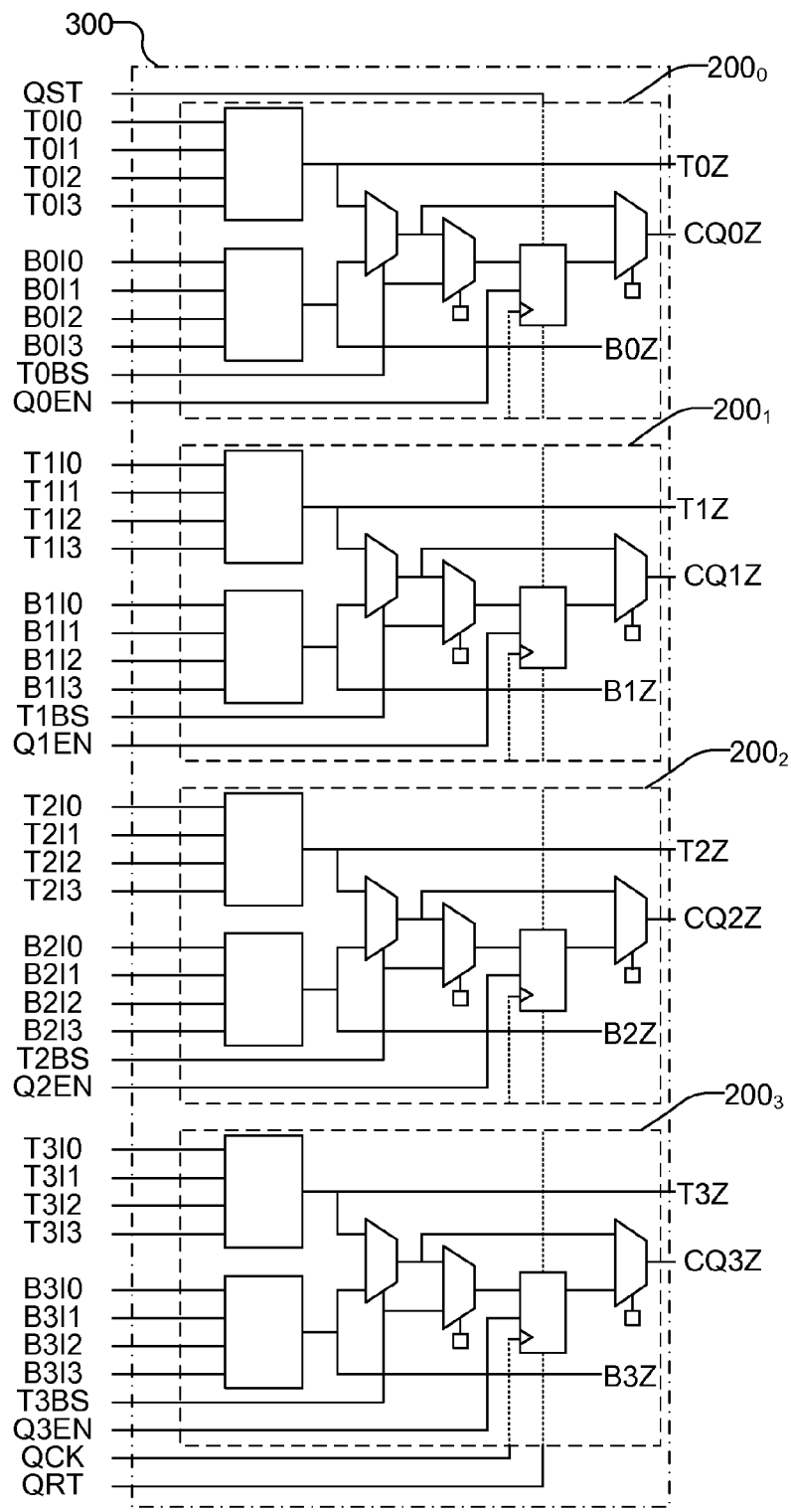
FIG. 5 illustrates a super logic cell, which is implemented with a plurality of the logic cells from FIG. 3.

FIG. 5 illustrates a super logic cell 300, which is a cluster of logic elements, implemented with a plurality of logic cells 200 illustrated in FIG. 3. The super logic cell 300 may serve as a logic block 102 in the programmable logic device 100 shown in FIG. 2. As illustrated, the super logic cell 300 includes four logic cells $200_0$, $200_1$, $200_2$, and $200_3$ (sometimes collectively referred to as logic cells 200). If desired, more or fewer logic cells may be contained within the super logic cell 300. All four logic cells 200 may share the same clock input QCK, reset input QRT and set input QST from the routing network for their respective registers, as illustrated with dotted lines within the logic cells. Each of the logic cells 200, however, may receive an independent flip-flop enable signals Q0EN, Q1EN, Q2EN, and Q3EN. From the super logic cell 300, eight outputs, namely T0Z, CQ0Z, T1Z, CQ1Z, T2Z, CQ2Z, T3Z and CQ3Z from logic cells $200_0$, $200_1$, $200_2$, and $200_3$, respectively, may be provided to other super logic cells through the routing network. The outputs B0Z, B1Z, B2Z and B3Z from logic cells $200_0$, $200_1$, $200_2$, and $200_3$, respectively, however, may not be provided to other super logic cells through the routing network, but may be used if and when required during logical path formation, to feed back to the same super logic cell 300, e.g., through a dedicated feedback network, not shown. If desired, the eight outputs, T0Z, CQ0Z, T1Z, CQ1Z, T2Z, CQ2Z, T3Z and CQ3Z from logic cells $200_0$, $200_1$, $200_2$, and $200_3$, respectively, may also be used as feedback to the same super logic cell 300, e.g., through the dedicated feedback network, not shown. Alternatively, outputs B0Z, B1Z, B2Z and B3Z may also be provided, if desired, to other super logic cells through the routing network.

Figure 6:
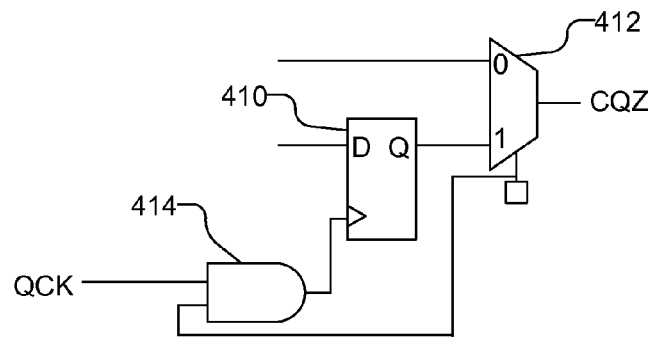
FIG. 6 illustrates a register with a gated clock input.

FIG. 6 illustrates a register 410 of a logic cell within a programmable logic device that receives a gated clock input. Similar to the register 210, shown in FIG. 3, register 410 includes a data D input terminal, an output terminal Q that is coupled to an input terminal of multiplexor 412, and a clock terminal driven by input QCK from the routing network 201. The register 410 may include further terminals, such as a set terminal, reset terminal and flip-flop enable terminal, similar to register 210 discussed above.

The register 410, however, receives the clock input QCK via a logic AND gate 414. While a logic AND gate is illustrated, it should be understood that any other appropriate logic gate may be used. The AND gate 414 receives the clock input QCK, e.g., via the routing network 201 as well as the select signal from multiplexor 412. The select terminal of the multiplexor 412 may be fixed, e.g., an SRAM-bit programmed at time of initiation of the programmable logic device a tie high (VDD) signal or a tie low (GND) signal. Accordingly, when the select terminal of the multiplexor 412 is high, i.e., 1, thereby selecting the input terminal coupled to output terminal Q of the register 410, the clock signal QCK is passed to the clock input terminal of register 410 via AND gate 414. On the other hand, when the select terminal of the multiplexor 412 is low, i.e., 0, thereby selecting the input terminal that is not coupled to output terminal Q of the register 410, the AND gate 414 will produce a low signal thereby preventing the clock signal QCK from being received on the clock input terminal of register 410. Accordingly, when multiplexor 412 does not select the output from register 410, the clock signal to the register 410 is gated off thereby reducing dynamic power consumption.

Figure 7:
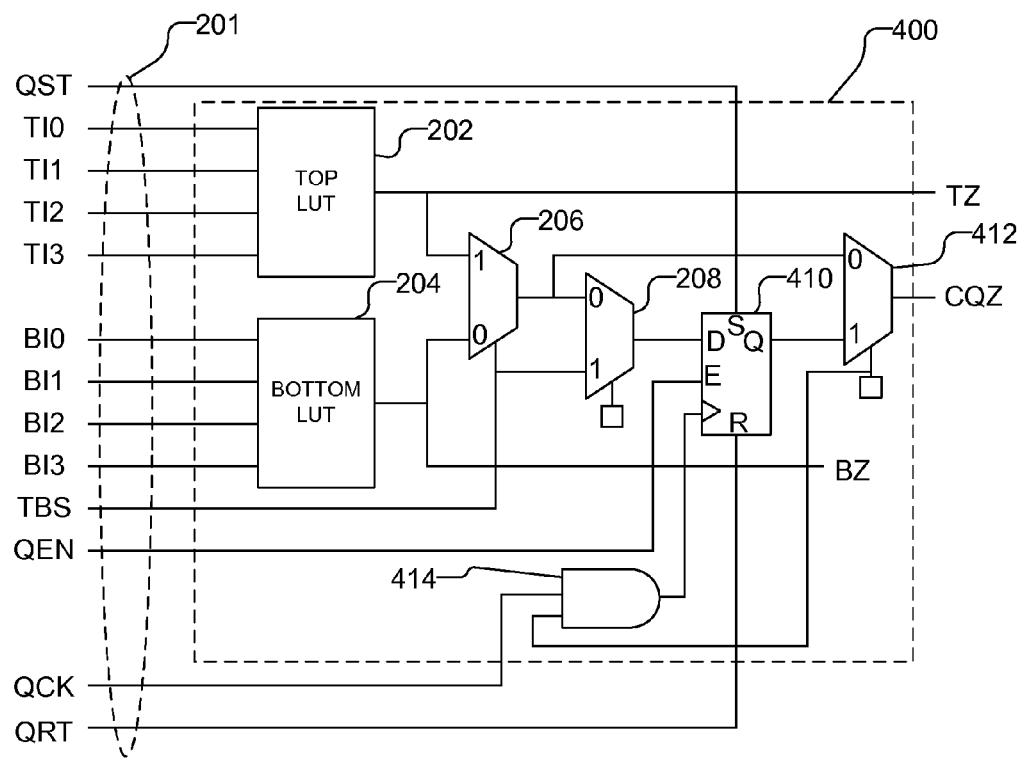
FIG. 7 illustrates a logic cell, which is similar to the logic cell in FIG. 3, and that includes a gated clock input to a register.

If desired, the gated clock input for the register may be used in a logic cell similar to logic cell 200 shown in FIG. 3. For example, FIG. 7 illustrates a logic cell 400, which is similar to logic cell 200 in FIG. 3, like designated elements being the same, but includes the register 410, multiplexor 412, and logic gate 414, as discussed above. If desired, however, the gated clock input for the register 410 may be used in a logic cell that is different than that illustrated in FIG. 3 or FIG. 7.

Figure 8:
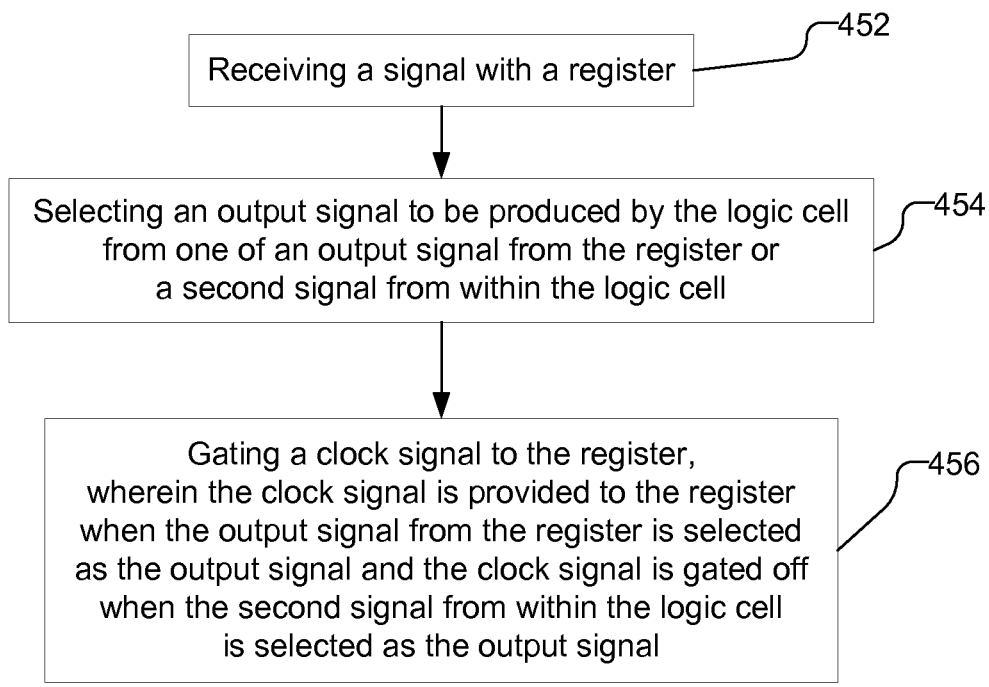
FIG. 8 is a flow chart illustrating a method performed by a logic cell in which the clock input to the register is gated.

Thus, as can be seen in FIG. 8, a method is performed by a logic cell within a programmable logic device that includes receiving a signal with a register (452); selecting an output signal to be produced by the logic cell from one of an output signal from the register or a second signal from within the logic cell; and gating a clock signal to the register (454). The clock signal is gated to be provided to the register when the output signal from the register is selected as the output signal and the clock signal is gated off when the second signal from within the logic cell is selected as the output signal (456). Additionally, the signal received by the register may be selected between a combinatorial logic signal and a data input signal from a routing network, e.g., TBS input from routing network 201. The second signal from within the logic cell may be the combinatorial logic signal. Additionally, a first output signal from a first logic element and a second output signal from a second logic element may be selected to be provided as the combinatorial logic signal, e.g., based on the data input signal.

Figure 9:
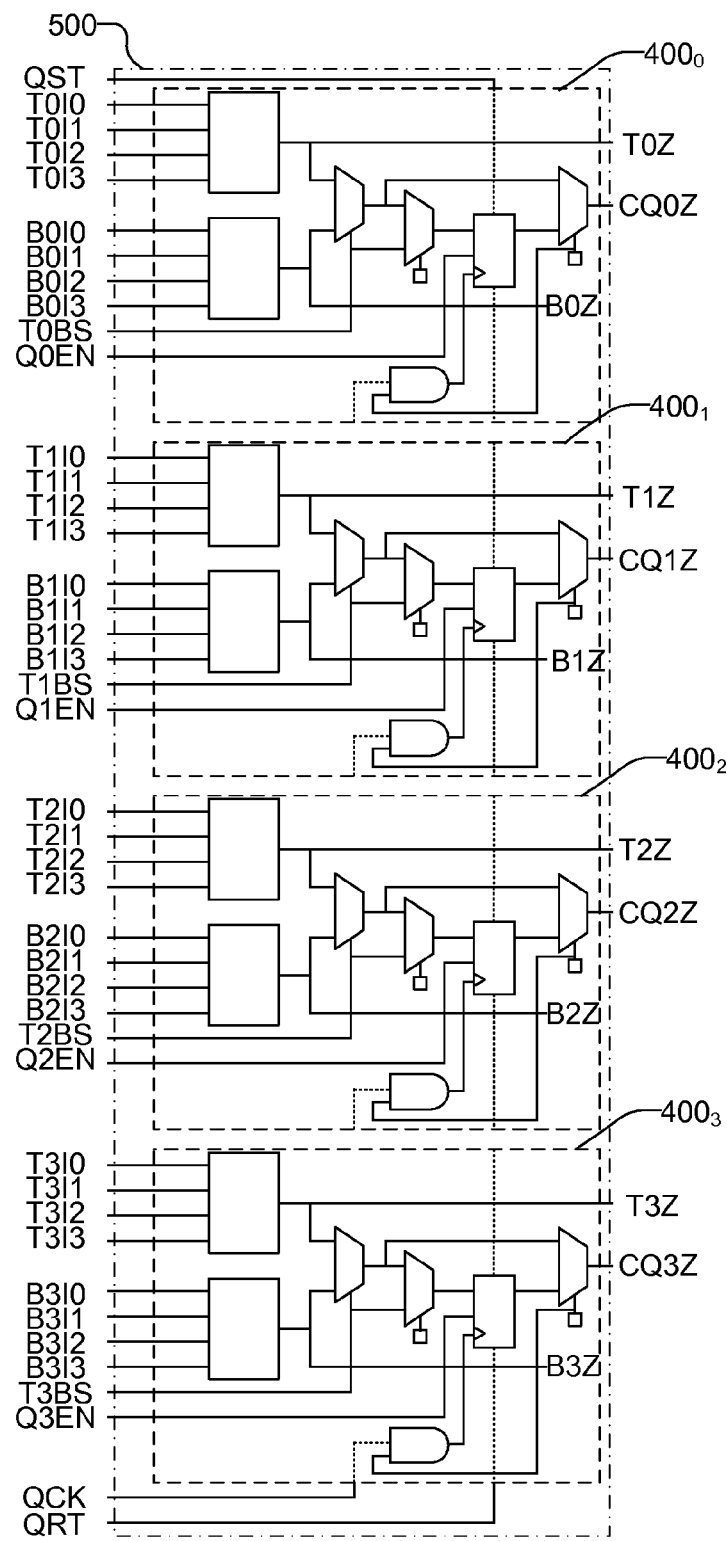
FIG. 9 illustrates a super logic cell, which is implemented with a plurality of the logic cells from FIG. 7.

FIG. 9 illustrates a super logic cell 500, which is implemented with a plurality of logic cells 400, which include gated clock signals to the registers, as illustrated in FIG. 7. The super logic cell 500 may serve as a logic block 102 in the programmable logic device 100 shown in FIG. 2. As illustrated, the super logic cell 500 includes four logic cells 4000, 4001, 4002, and 4003 (sometimes collectively referred to as logic cells 400). If desired, more or fewer logic cells may be contained within the super logic cell 500. Similar to super logic cell 300 shown in FIG. 5, all of the logic cells 400 may use the same clock input QCK, reset input QRT and set input QST from the routing network for their respective registers, as illustrated with dotted lines within the logic cells. Each of the logic cells 400, however, independently gates the clock input QCK signal with the select signal from the third multiplexor, which selects between the output from the register and the output of the combinatorial logic. Accordingly, the clock signal to the registers in each logic cell within the super logic cell may be independently gated based on the function of the logic cell in which resides, thereby reducing dynamic power consumption.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A programmable logic device, comprising:
a routing network;
a plurality of logic cells, each logic cell in the plurality of logic cells comprises a plurality of input terminals coupled to the routing network and at least one output terminal, the logic cell comprising:
a first logic element having a first plurality of input terminals coupled to the routing network and a first output terminal;
a second logic element having a second plurality of input terminals coupled to the routing network and a second output terminal;
a first multiplexor having a first mux input terminal coupled to the first output terminal and a second mux input terminal coupled to the second output terminal and a first multiplexor select terminal coupled to receive a dynamic select signal from the routing network, the first multiplexor having a third output terminal;
a second multiplexor having a third mux input terminal coupled to the third output terminal and a fourth mux input terminal coupled to the first multiplexor select terminal coupled to receive the dynamic select signal from the routing network, the second multiplexor having a fourth output terminal;
a register having a register data terminal coupled to the fourth output terminal and a fifth output terminal coupled to an output terminal of the logic cell; and
the programmable logic device further comprises a super logic cell comprising the plurality of the logic cells, wherein the register in each logic cell in the plurality of the logic cells has a SET terminal and a RESET terminal coupled to receive a same SET signal and RESET signal from the routing network.

2. The programmable logic device of claim 1, wherein the first logic element comprises a first look-up table and the second logic element comprises a second look-up table.

3. The programmable logic device of claim 1, wherein the second multiplexor has a second multiplexor select terminal that is coupled to receive a multiplexor select signal that selects to provide an output signal from the first multiplexor on the fourth output terminal or to provide the dynamic select signal from the routing network as a data signal on the fourth output terminal.

4. The programmable logic device of claim 3, wherein the second multiplexor select terminal is coupled to receive a fixed select signal.

5. The programmable logic device of claim 1, wherein the fifth output terminal of the register is coupled to the output terminal of the logic cell through a third multiplexor.

6. The programmable logic device of claim 5, wherein the third multiplexor comprises a fifth mux input terminal coupled to the third output terminal of the first multiplexor, a sixth mux input terminal coupled to the fifth output terminal of the register, and a sixth output terminal coupled to the output terminal of the logic cell.

7. The programmable logic device of claim 5, wherein the third multiplexor comprises a third multiplexor select terminal, and wherein the register comprises a clock terminal, the clock terminal coupled to receive a clock signal from the routing network that is gated with a signal from the third multiplexor select terminal.

8. The programmable logic device of claim 7, wherein the clock signal is AND gated with the signal from the third multiplexor select terminal.

9. The programmable logic device of claim 7, wherein the third multiplexor select terminal is coupled to receive a fixed select signal.

10. The programmable logic device of claim 1, further comprising a plurality of the super logic cells.

11. A method performed by a logic cell within a programmable logic device, the method comprising:
selecting between a first output signal from a first logic element and a second output signal from a second logic element based on a select signal from a routing network to produce a combinatorial logic signal;
selecting between the combinatorial logic signal and the select signal from the routing network to produce a register data input signal;
receiving the register data input signal with a register; and
receiving a SET signal and a RESET signal from the routing network with the register, wherein the logic cell is one of a plurality of logic cells in a super logic cell in the programmable logic device and the SET signal and the RESET signal from the routing network are received by registers in each of the plurality of logic cells in the super logic cell.

12. The method of claim 11, wherein selecting between the combinatorial logic signal and the select signal from the routing network is based on a fixed select signal.

13. The method of claim 11, further comprising:
selecting a logic cell output signal to be produced by the logic cell from one of an output signal from the register or a signal from within the logic cell.

14. The method of claim 13, wherein the signal from within the logic cell is the combinatorial logic signal.

15. The method of claim 13, gating a clock signal to the register, wherein the clock signal is provided to the register when the output signal from the register is selected as the logic cell output signal and the clock signal is gated off when the signal from within the logic cell is selected as the logic cell output signal.

16. The method of claim 15, wherein the selecting the logic cell output signal is based on a fixed select signal.

17. A programmable logic device, comprising:
a routing network;
a plurality of super logic cells coupled to the routing network, each of the plurality of super logic cells comprises a plurality of logic cells, wherein each logic cell in the plurality of logic cells receives at least one common signal from the routing network and wherein each logic cell comprises a plurality of input terminals coupled to receive different signals from the routing network and at least one output terminal and comprises:
a first logic element having a first plurality of input terminals coupled to the routing network and a first output terminal;
a second logic element having a second plurality of input terminals coupled to the routing network and a second output terminal;
a first multiplexor having a first mux input terminal coupled to the first output terminal and a second mux input terminal coupled to the second output terminal and a first multiplexor select terminal coupled to receive a dynamic select signal from the routing network, the first multiplexor having a third output terminal;
a second multiplexor having a third mux input terminal directly coupled to the third output terminal and a fourth mux input terminal coupled to the first multiplexor select terminal coupled to receive the dynamic select signal from the routing network, the second multiplexor having a fourth output terminal; and
a register having a register data terminal coupled to the fourth output terminal and a fifth output terminal coupled to an output terminal of the logic cell.

18. The programmable logic device of claim 17, wherein the second multiplexor has a second multiplexor select terminal that is coupled to receive a multiplexor select signal that selects to provide an output signal from the first multiplexor on the fourth output terminal or to provide the dynamic select signal from the routing network as a data signal on the fourth output terminal.

19. The programmable logic device of claim 18, wherein the second multiplexor select terminal is coupled to receive a fixed select signal.

20. The programmable logic device of claim 17, wherein the fifth output terminal of the register is coupled to the output terminal of the logic cell through a third multiplexor.

21. The programmable logic device of claim 20, wherein the third multiplexor comprises a fifth mux input terminal coupled to the third output terminal of the first multiplexor, a sixth mux input terminal coupled to the fifth output terminal of the register, and a sixth output terminal coupled to the output terminal of the logic cell.

22. The programmable logic device of claim 20, wherein the third multiplexor comprises a third multiplexor select terminal, and wherein the register comprises a clock terminal, the clock terminal coupled to receive a clock signal from the routing network that is gated with a signal from the third multiplexor select terminal.

23. The programmable logic device of claim 22, wherein the clock signal is AND gated with the signal from the third multiplexor select terminal.

24. The programmable logic device of claim 22, wherein the second mux select terminal is coupled to receive a fixed select signal.

25. A programmable logic device comprising a logic cell, the logic cell comprising:
a register having a register data terminal, a clock terminal, and a first output terminal;
a first multiplexor comprising a first input terminal, a second input terminal coupled to the first output terminal of the register, a select terminal, and a second output terminal coupled to an output terminal of the logic cell; and
a logic gate having a third input terminal coupled to the select terminal of the first multiplexor, a fourth input terminal coupled to receive a clock signal, and a third output terminal, wherein the third output terminal of the logic gate is coupled to the clock terminal of the register.

26. The programmable logic device of claim 25, wherein the logic gate is an AND gate.

27. The programmable logic device of claim 25, wherein the select terminal is coupled to receive a fixed select signal.

28. The programmable logic device of claim 25, wherein the register data terminal is coupled to an output terminal of a second multiplexor that selects between combinatorial logic and a data input signal from a routing network.

29. The programmable logic device of claim 25, wherein the first input terminal of the first multiplexor is coupled to receive a signal from within the logic cell.

30. The programmable logic device of claim 29, wherein the signal from within the logic cell is a combinatorial logic signal from combinatorial logic in the logic cell.

31. The programmable logic device of claim 30, wherein the combinatorial logic in the logic cell comprises a first logic element having a first plurality of input terminals coupled to a routing network and a first output terminal and a second logic element having a second plurality of input terminals coupled to the routing network and a second output terminal, and a second multiplexor coupled to the first output terminal and the second output terminal.

32. The programmable logic device of claim 31, wherein the first logic element comprises a first look-up table and the second logic element comprises a second look-up table, and wherein the second multiplexor has an output terminal and a second select terminal coupled to receive a dynamic select signal from the routing network, the programmable logic device further comprising a third multiplexor coupled with an input terminal coupled to the output terminal of the second multiplexor, a second input terminal coupled to the dynamic select signal from the routing network, and an output terminal coupled to the register data terminal of the register.

33. The programmable logic device of claim 25, further comprising:
a routing network;
a plurality of super logic cells coupled to the routing network, each of the plurality of super logic cells comprising a plurality of the logic cells, wherein the logic gate in each logic cell in a super logic cell is coupled to receive the clock signal from the routing network.

34. A method performed by a logic cell in a programmable logic device, the method comprising:
receiving a signal with a register;
selecting an output signal to be produced by the logic cell from one of an output signal from the register or a second signal from within the logic cell; and
gating a clock signal to the register, wherein the clock signal is provided to the register when the output signal from the register is selected as the output signal and the clock signal is gated off when the second signal from within the logic cell is selected as the output signal.

35. The method of claim 34, wherein the selecting the output signal is based on a fixed select signal.

36. The method of claim 34, further comprising selecting between a combinatorial logic signal and a data input signal from a routing network to be provided as the signal received by the register.

37. The method of claim 36, wherein the second signal from within the logic cell comprises the combinatorial logic signal.

38. The method of claim 36, further comprising selecting a first output signal from a first logic element and a second output signal from a second logic element to be provided as the combinatorial logic signal.

39. The method of claim 38, wherein the selecting the first output signal from the first logic element and the second output signal from the second logic element is based on the data input signal.

* * * * *